(12) United States Patent
Morita et al.

(10) Patent No.: US 8,749,279 B2
(45) Date of Patent: Jun. 10, 2014

(54) DRIVER APPARATUS FOR SWITCHING ELEMENTS

(71) Applicant: Denso Corporation, Kariya (JP)

(72) Inventors: Hiroyuki Morita, Kariya (JP); Tsuneo Maebara, Nagoya (JP); Takeyasu Komatsu, Chiryu (JP); Ryotaro Miura, Kariya (JP); Tomotaka Suzuki, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 13/959,907

(22) Filed: Aug. 6, 2013

(65) Prior Publication Data

US 2014/0035629 A1 Feb. 6, 2014

(30) Foreign Application Priority Data

Aug. 6, 2012 (JP) ................... 2012-173717

(51) Int. Cl.
*H03K 3/00* (2006.01)
(52) U.S. Cl.
USPC .......................................... 327/109
(58) Field of Classification Search
USPC .......................................... 327/109
See application file for complete search history.

(56) References Cited

U.S. PATENT DOCUMENTS

| 5,608,595 | A | 3/1997 | Gourab et al. |
| 7,977,932 | B2 * | 7/2011 | Morishita ............... 323/314 |

FOREIGN PATENT DOCUMENTS

| JP | 05-218836 | 8/1993 |
| JP | 07-297358 | 11/1995 |
| JP | 2010-246251 | 10/2010 |

* cited by examiner

*Primary Examiner* — Daniel Rojas
(74) *Attorney, Agent, or Firm* — Nixon & Vanderhye PC

(57) ABSTRACT

In a driver apparatus for driving a voltage-controlled switching element, an absolute value of a voltage difference between a voltage at a reference terminal that is one of terminals of a current path of the switching element and a voltage at the switching control terminal of the switching element is clamped at a clamping voltage greater than a threshold voltage. A voltage greater than the threshold voltage applied to the switching control terminal allows the switching element to be turned on. When the current flowing through the switching element becomes equal to or greater than a clamp threshold after the switching element transitions from an off-state to an on-state, a voltage-drop-rate at which the absolute value is decreased to the clamping voltage is decreased.

10 Claims, 9 Drawing Sheets

FIG.5A FIRST EMBODIMENT
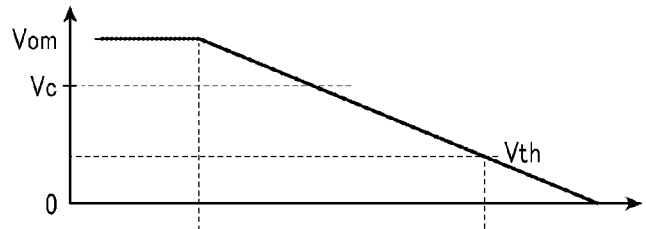
(a) Vge
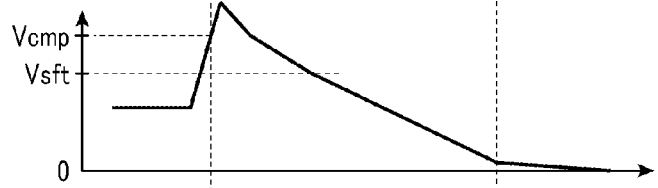
(b) Vse
(c) SW26
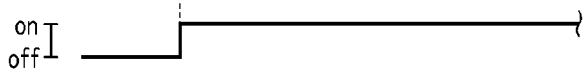
(d) SW42
FIG.5B COMPARATIVE EXAMPLE
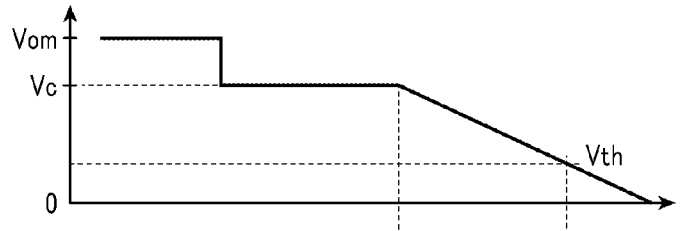
(a) Vge
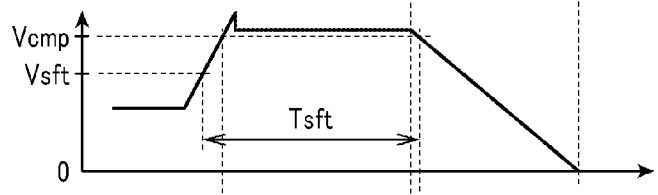
(b) Vse
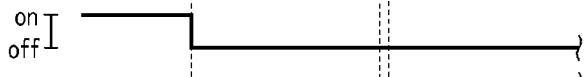
(c) SW26
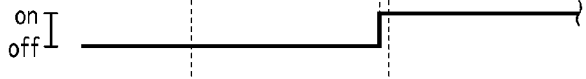
(d) SW42
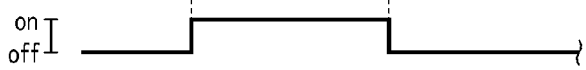
(e) SW50

DRIVER APPARATUS FOR SWITCHING ELEMENTS

CROSS-REFERENCE TO RELATED APPLICATION

This application is based on and claims the benefit of priority from earlier Japanese Patent Application No. 2012-173717 filed Aug. 6, 2012, the description of which is incorporated herein by reference.

(BACKGROUND)

1. Technical Field

The present invention relates to a driver apparatus for driving voltage-controlled switching elements.

2. Related Art

A known driver apparatus, as disclosed in Japanese Patent Application Laid-Open Publication No. 2010-246251, clamps a voltage between a gate and an emitter of a switching element (IGBT) at a clamping voltage when a current following through the switching element increases excessively.

In general, a current flowing through the switching element may increase more excessively when the switching element is turned off than when the switching element is in an on-state with a voltage between the gate and the emitter of the switching element being kept constant. An amount of current flowing through the switching element when the switching element is turned off may increase since a maximum value of current allowed to flow through the switching element may increase with increasing voltage between the gate and the emitter of the switching element. Accordingly, clamping the voltage between the gate and the emitter of the switching element when the switching element is in the on-state with the constant voltage between the gate and the emitter and excessively large current is flowing through the switching element may lead to an increased reduction rate of current flowing through the switching element, which may cause an increased surge current.

In consideration of the foregoing, it would therefore be desirable to have a driver apparatus for driving a voltage-controlled switching element by manipulating a voltage at a switching control terminal of the switching element in response to a received operation signal, which is capable of advantageously suppressing a surge voltage.

SUMMARY

In accordance with an exemplary embodiment of the present invention, there is provided a driver apparatus for driving a voltage-controlled switching element. The apparatus includes: on-state transition means for, in response to a first operation signal indicative of turn-on instruction, turning on the switching element by charging a switching control terminal of the switching element; off-state transition means for, in response to a second operation signal indicative of turn-off instruction, turning off the switching element by discharging the switching control terminal of the switching element; clamp means for clamping an absolute value of a voltage difference between a voltage at a reference terminal that is one of terminals of a current path of the switching element and a voltage at the switching control terminal of the switching element at a clamping voltage that is greater than a threshold voltage, a voltage above which applied to the switching control terminal allowing the switching element to be turned on; and voltage-drop-rate decreasing means for, when an amount of current flowing through the current path of the switching element becomes equal to or greater than a clamp threshold value after the switching element transitions from an off-state to an on-state, decreasing a voltage-drop-rate at which the absolute value of the voltage difference is decreased to the clamping voltage as compared to a voltage-drop-rate at which the absolute value of the voltage difference is decreased to the clamping voltage by the off-state transition means only.

With this configuration having the voltage-drop-rate decreasing means described above, when, after the switching element transitions from the off-state to the on-state and the voltage difference is thereby increased to some extent, an amount of current flowing through the current path of the switching element becomes equal to or greater than the clamp threshold value, the voltage-drop-rate at which the absolute value is decreased to the clamping voltage may be decreased as compared to the voltage-drop-rate at which the absolute value is decreased to the clamping voltage. This can advantageously suppress a surge voltage.

BRIEF DESCRIPTION OF THE DRAWINGS

FIGS. 5A and 5B show timing diagrams for explaining benefits of the first embodiment;

DESCRIPTION OF SPECIFIC EMBODIMENTS

First Embodiment

There will now be explained a driver apparatus for switching elements, which is applied to a power conversion circuit electrically connected to a vehicle prime mover, in accordance with a first embodiment of the present invention with reference to accompanied drawings.

Figure 1:
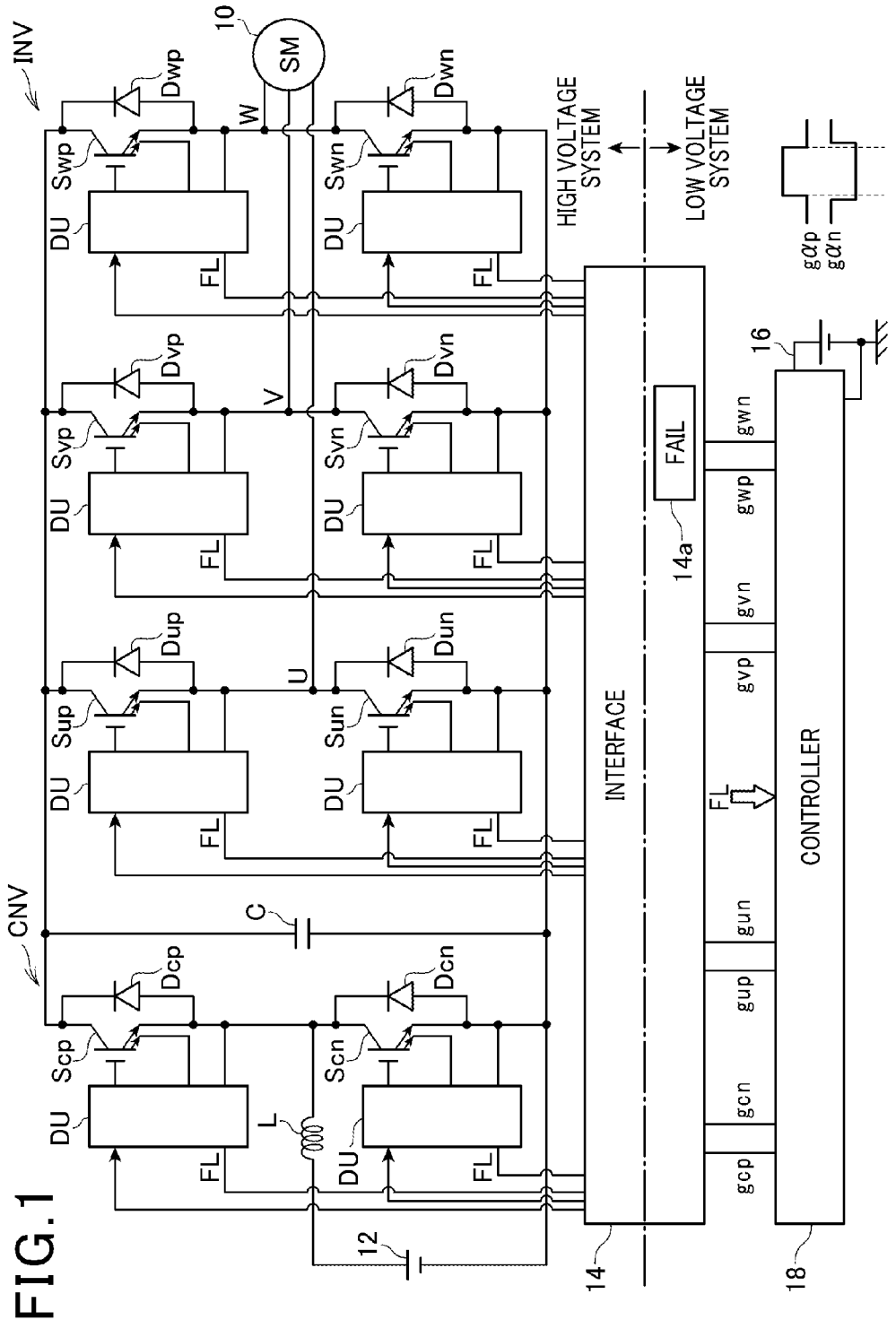
FIG. 1 shows a schematic block diagram of a control system in accordance with a first embodiment of the present invention.

FIG. 1 shows a schematic block diagram of a control system in accordance with a first embodiment of the present invention. In the system, a motor-generator 10 is a vehicle prime mover mechanically connected to a drive wheel (not shown). The motor-generator 10 is electrically connected to a high-voltage battery 12 through an inverter INV and a boost converter CNV. The boost converter CNV includes a capacitor C, a pair of switching elements Scp, Scn electrically connected in parallel with the capacitor C, and a reactor L electrically connected between a junction between the pair of switching elements Scp, Scn and a positive terminal of the high-voltage battery 12. The boost converter CNV boosts a voltage (e.g., of 100V) of the high-voltage battery 12 up to a predetermined voltage (e.g., of 666V) by turning on and off the switching elements Scp, Scn. The inverter INV includes a pair of switching elements Sup, Sun electrically connected in series at a first junction (a first series connection of switching elements), a pair of switching elements Svp, Svn electrically connected in series at a second junction (a second series connection of switching elements), and a pair of switching elements Swp, Swn electrically connected in series at a third junction (a third series connection of switching elements). The first to third junctions of the respective series connections of switching elements are electrically connected to the U-, V-, and W-phase terminals of the motor-generator 10, respectively. In the present embodiment, each of the switching elements Saβ (a=u,v,w, β=p,n) is an insulated gate bipolar transistor (IGBT) and is electrically connected in anti-parallel with a respectively corresponding diode Daβ (a=u,v,w, β=p, n).

A controller 18 is powered by a low-voltage battery 16. The controller 18 operates the inverter INV and the boost converter CNV to control a control quantity as desired for controlling the motor-generator 10. More specifically, the controller 18 outputs operation signals gcp, gcn to drive units DUs to operate the switching elements Scp, Scn of the boost converter CNV. The controller 18 further outputs operation signals gup, gun, gyp, gvn, gwp, gwn to drive units DUs to operate the switching elements Sup, Sun, Svp, Svn, Swp, Swn of the inverter INV. In other words, each of the high-side switching elements Sap and a corresponding one of the low-side switching elements San are alternately in the on-state.

The high-voltage system including the high-voltage battery 12 and the low-voltage system including the low-voltage battery 16 are electrically isolated from each other, and communicate signals therebetween via an interface 14 including insulated communication means, such as a photocoupler.

Figure 2:
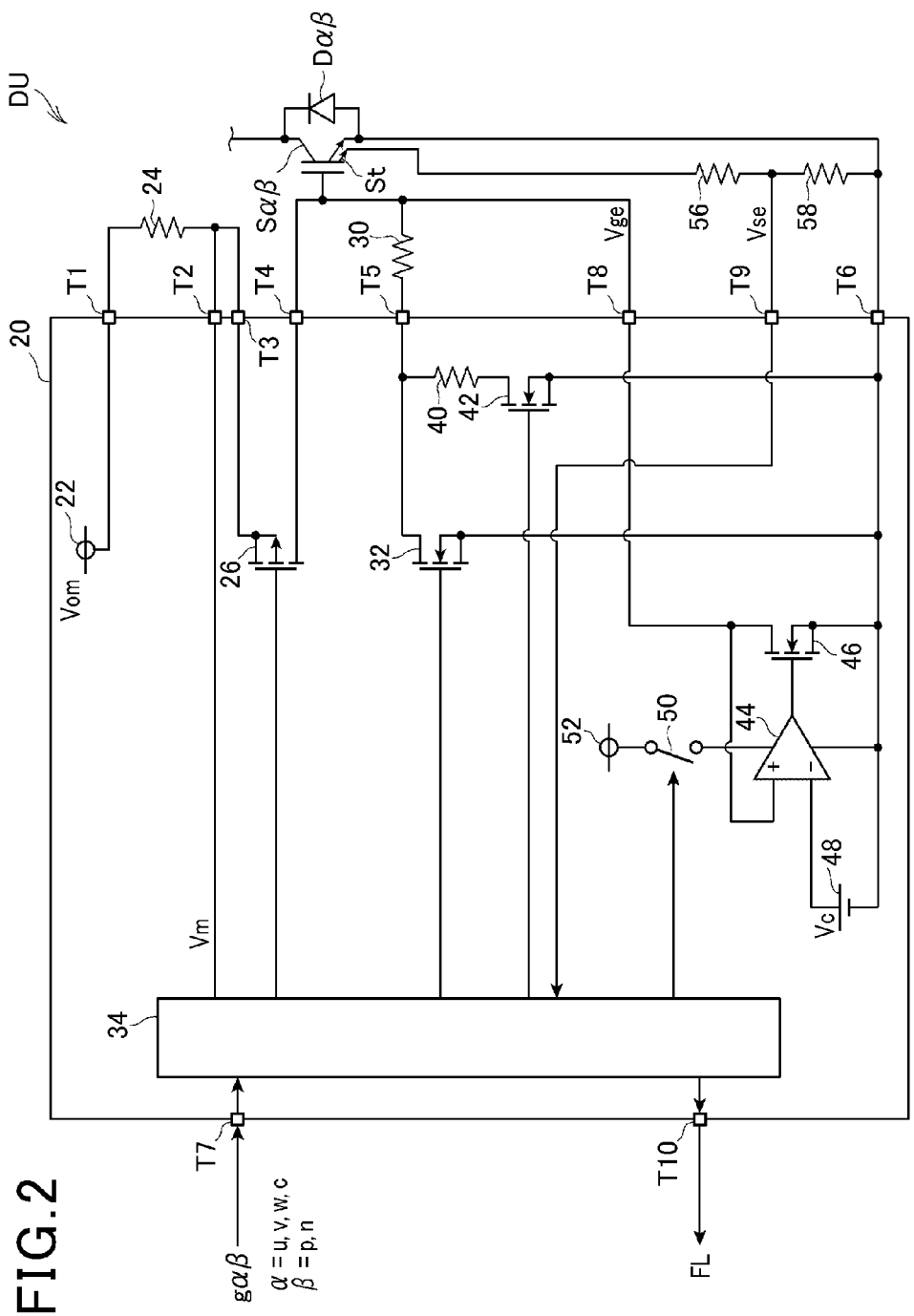
FIG. 2 shows a schematic circuit diagram of a drive unit of the first embodiment.

FIG. 2 shows a schematic block diagram of each of the drive units DUs.

As shown in FIG. 2, the drive unit DU includes a drive integrated circuit (drive IC) 20 that is a semiconductor integrated circuit chip. The drive IC 20 includes a direct-current (DC) voltage source 22 having a terminal voltage Vom. A terminal of the DC voltage source 22 is electrically connected to the gate of the switching element Saβ through a terminal T1, a constant-current resistor 24, a terminal T3, a P-channel MOSFET (as a constant-current switching element) 26, and a terminal T4.

The gate of the switching element Saβ is electrically connected to a terminal T6 through a gate resistor 30, a terminal T5, and an N-channel MOSFET (as a discharge switching element) 32. The terminal T6 is electrically connected to an electrical-current flow path between the emitter and the collector of the switching element Saβ via one of the terminals of the path (i.e., the emitter).

The constant-current switching element 26 and the discharge switching element 32 are operated by a drive controller 34 in the drive IC 20. The drive controller 34 drives the switching element Saβ by alternating turning on and off the constant-current switching element 26 and the discharge switching element 32 in response to an operation signal gaβ received via a terminal T7. More specifically, when the operation signal gaβ is an instruction to turn on the switching element Saβ, the drive controller 34 turns off the discharge switching element 32 and turns on the constant-current switching element 26. When the operation signal gaβ is an instruction to turn off the switching element Saβ, the drive controller 34 turns on the discharge switching element 32 and turns off the constant-current switching element 26.

During a time period where the constant-current switching element 26 is in the on-state, an applied voltage to the switching control terminal (the gate) of the switching element 26 is controlled so that an amount of voltage drop across the constant-current resistor 24 (the voltage Vm at the terminal T2) is kept at a specified value. This leads to a constant current flowing through the constant-current resistor 24, and thus to constant-current control of charging the gate of the switching element Saβ.

The terminal T5 is electrically connected to the terminal T6 through the soft-interruption resistor 40 and the N-channel MOSFET (as a soft-interruption switching element) 42.

The gate of the switching element Saβ is electrically connected to a terminal T8, which is in turn electrically connected to the terminal T6 through a N-channel MOSFET (as a clamping switching element) 46. An output voltage of the operational amplifier 44 is applied to the gate of the clamping switching element 46. A clamping voltage Vc of the power supply 48 is applied to an inverting input terminal of the operational amplifier 44. A gate voltage Vge of the switching element Saβ is applied to a non-inverting input terminal of the operational amplifier 44 via the terminal T8. Power supply of the power supply 52 to the operational amplifier 44 is turned on and off by the power-supply switching element 50.

The switching element Saβ further includes a sense terminal St that outputs a small current having correlation with a current (as a collector current) following through the electrical-current flow path (between the emitter and the collector of the switching element Saβ). The sense terminal St is electrically connected to the emitter of the switching element Saβ through a series connection of resistors 56, 58. This allows a voltage drop across the resistor 58 (the sense voltage Vse) caused by the current outputted from the sense terminal St to be an electrical state quantity as a function of an amount of voltage drop across the flow path of the switching element Saβ.

The drive controller 34 receives the sense voltage Vse via a terminal T9. On the basis of the sense voltage Vse, the drive controller 34 operates the power-supply switching element 50 and the soft-interruption switching element 42. This process will now be explained below.

Figure 3:
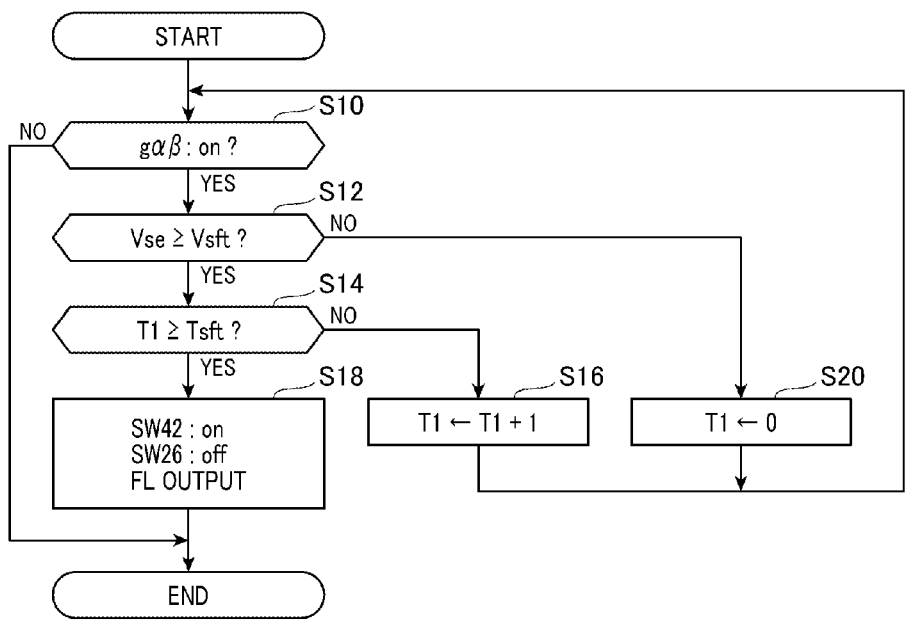
FIG. 3 shows a flowchart of a soft-interruption process of the first embodiment.

FIG. 3 shows a flowchart of a soft-interruption process performed by the drive controller on the basis of the sense voltage Vse.

First, in step S10, it is determined whether or not the operation signal gaβ is the instruction to turn on the switching element Saβ (hereinafter referred to as a turn-on instruction). If it is determined in step S10 that the operation signal gaβ is the turn-on instruction, then it is determined in step S12 whether or not the sense voltage Vse is equal to or greater than a soft-interruption threshold voltage Vsft (corresponding to a soft-interruption threshold value). This operation in step S12 is performed for determining whether or not an excessively large current is flowing through the switching element Saβ. The soft-interruption threshold voltage Vsft is set greater than a voltage corresponding to a maximum current that flows through the switching element Saβ in normal operation.

If it is determined in step S12 that the sense voltage Vse is equal to or greater than the soft-interruption threshold voltage Vsft, then it is determined in step S14 whether or not a counter value T1, during which it is continuously determined that the sense voltage Vse is equal to or greater than the soft-interruption threshold voltage Vsft, is equal to or greater than a soft-interruption threshold time Tsft. This operation in step S14 is performed for determining whether or not a condition for forcibly turning off the switching element Saβ is met. The soft-interruption threshold time Tsft may be set at a value that can prevent the condition from being wrongly determined to be met due to noise or the like.

If it is determined in step S14 that the counter value T1 is less than the soft-interruption threshold time Tsft, then the counter value T1 is incremented by one in step S16. If it is determined in step S12 that the sense voltage Vse is less than the soft-interruption threshold voltage Vsft, then the counter value T1 is initialized to zero. The process returns to step S10 after completion of the operation in step S16 or the operation in step S20.

If it is determined in step S14 that the counter value T1 is equal to or greater than the soft-interruption threshold time Tsft, then in step S18, the soft-interruption switching element 42 is turned on and the constant-current switching element 26 is turned off. Further, in step S18, a fail signal FL is fed to the controller 18 via the terminal T10 shown in FIG. 2. In response to the fail signal FL, a fail processor 14a as shown in FIG. 1 shuts down the inverter INV and the boost converter CNV. The fail processor 14a may have a similar configuration as disclosed in FIG. 3 of Japanese Patent Application Laid-Open Publication No. 2009-60358.

After completion of the operation in step S18 or if it is determined in step S10 that the operation signal gaβ is the instruction to turn off the switching element Saβ (hereinafter referred to as a turn-off instruction), the process terminates for this iteration. The drive controller 34 thus includes means for executing the operation in Step S14 and the operation in step S18 (transient protection means).

Figure 4:
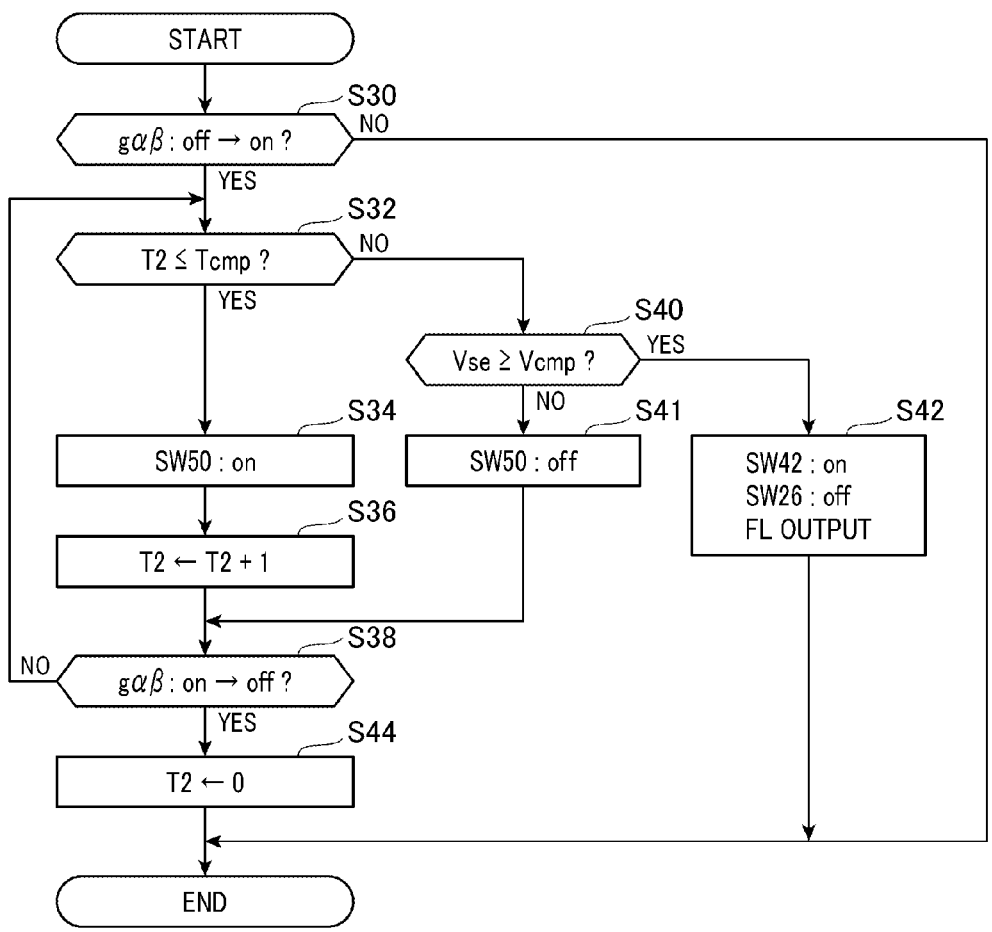
FIG. 4 shows a flowchart of a clamp process of the first embodiment.

FIG. 4 shows a flowchart of another soft-interruption process performed by the drive controller 34 on the basis of the sense voltage Vse.

First, in step S30, it is determined whether or not the operation signal gaβ has changed from the turn-off instruction to the turn-on instruction. If it is determined in step S30 that the operation signal gaβ has changed from the turn-off instruction to the turn-on instruction, then it is determined in step S32 whether or not a counter value T2, which is a lapsed time from when it is determined in step S30 that the operation signal gaβ has changed from the turn-off instruction to the turn-on instruction, is equal to or less than a clamping threshold time Tcmp. This operation in step S32 is performed for determining whether to guard a gate voltage Vge of the switching element Saβ with a clamping voltage Vc.

When an upper-arm switching element Sap and its corresponding lower-arm switching element San are both in the on-state where the switching elements Sap, San are short-circuited, an electrical current flowing through the upper- and lower-arm switching elements Sap, San may increase abruptly, which may lead to a rapid increase of each of the gate voltages of the respective switching elements Sap, San. The above gate-voltage guard process is performed to overcome such a disadvantage. In other words, for example, the sense voltage Vse is compared with the clamping threshold voltage Vcmp (corresponding to a clamp threshold value). When the power-supply switching element 50 is turned on when it is determined that the sense voltage Vse is higher than the clamping threshold voltage Vcmp, the gate voltage Vge may rapidly increase once until the gate voltage Vge becomes the clamping voltage Vc, which may lead to excessively large current flowing through the switching elements Sap, San.

The clamping threshold time Tcmp is set at a time period equal to or greater than a time period required to start limiting a current flowing through the switching elements Sap, San after the drive controller 34 recognizes such a rapid increase of the sense voltage Vse. Further, the clamping threshold time Tcmp is set greater than a time period for the gate voltage Vge to become a threshold voltage Vth at which the switching element Saβ is turned on or transitions from the off state to the on-state. More specifically, the clamping threshold time Tcmp is set at a time period required for the gate voltage Vge to reach a mirror period in normal operation, where the mirror period is a time period during which the gate voltage Vge increases at a reduced increase rate of the gate voltage Vge after the rapid increase of the gate voltage Vge (preferably, a time period required for the gate voltage Vge to reach the end of the mirror period).

If is determined in step S32 that the counter value T2 is equal to or less than the clamping threshold time Tcmp, then the power-supply switching element 50 is turned on in step S34. This allows the gate voltage Vge to be limited to the clamping voltage Vc during the clamping threshold time Tcmp in the guard process. Subsequently, in step S36, the counter T2 is incremented.

If it is determined in step S32 that the counter value T2 is greater than the clamping threshold time Tcmp, then it is determined in step S40 that the sense voltage Vse is equal to or greater than the clamping threshold voltage Vcmp, where the clamping threshold voltage Vcmp is set greater than the soft-interruption threshold voltage Vsft. The clamping threshold voltage Vcmp is intended to be set so as to rapidly limit a current flowing through the upper- and lower-arm switching elements Sap, San when the upper- and lower-arm switching elements Sap, San are both in the on-state (i.e., short-circuited) and an excessive large current flows therethrough accordingly.

If it is determined in step S40 that the sense voltage Vse is less than the clamping threshold voltage Vcmp, then the power-supply switching element 50 is turned off in step S41. If it is determined in step S40 that the sense voltage Vse is equal to or greater than the clamping threshold voltage Vcmp, then in step S42, the soft-interruption switching element 42 is turned on, the constant-current switching element 26 is turned off, and a fail (FL) signal is outputted. The drive controller 34 thus includes means for executing the operation in Step S42 (voltage-drop-rate decreasing means).

After completion of the operation in step S41 or the operation in step S36, it is determined in step S38 whether the operation signal gaβ has changed from the turn-on instruction to the turn-off instruction. If it is determined in step S38 that the operation signal gaβ is still indicative of the turn-on instruction, then the process returns to step S32. If it is determined in step S38 that the operation signal gaβ has changed from the turn-on instruction to the turn-off instruction, then the counter T2 is initialized to zero in step S44.

After completion of the operation in step S42 or the operation in step S44, or if it is determined in step S30 that the operation signal gaβ is still the turn-off instruction, the process terminates for this iteration.

FIG. 5A shows an example of the present embodiment. The timing diagram (a) shows a progression of the gate voltage Vge. The timing diagram (b) shows a progression of the sense voltage Vse. The timing diagram (c) shows a progression of an operational state of the constant-current switching element 26. The timing diagram (d) shows a progression of an operational state of the soft-interruption switching element 42.

As shown in timing diagrams (a)-(d) of FIG. 5A, in the present embodiment, when the sense voltage Vse becomes equal to or greater than the clamping threshold voltage Vcmp, the constant-current switching element 26 is turned off, and the soft-interruption switching element 42 is turned on. This can decrease a voltage-drop rate in the presence of excessively large current flowing through the switching element Saβ, and can thereby suppress a surge voltage.

In contrast, in a comparative example shown in FIG. 5B, as shown in the timing diagram (e), the power-supply switching element 50 is turned on when the gate voltage Vge is equal to or greater than the clamping threshold voltage Vcmp. The gate voltage Vge is lowered to the clamping voltage Vc abruptly, which may increase the voltage-drop rate, and may thus lead to an increase in surge voltage.

There will now be explained benefits of the present embodiment described above.

(1) Once the gate voltage Vge exceeds the threshold voltage Vth, the switching element Saβ is tuned on. Thereafter, when the sense voltage Vse becomes equal to or greater than the clamping threshold voltage Vcmp, the switching element Saβ is turned off by turning on the soft-interruption switching element 42. This, when the current flowing through the switching element Saβ is more likely to increase, allows a rate of decrease in current flowing through the switching element Saβ to be limited, and thus allows a surge voltage to be suppressed, as compared to cases where a very large current flows through the switching element Saβ when the switching element Saβ is turned on.

(2) The soft-interruption switching element 42 is turned on in order to turn off the switching element Saβ when a duration in which the sense voltage Vse is equal to or greater than the soft-interruption threshold voltage Vsft (<Vcmp) becomes equal to or greater than the soft-interruption threshold time Tsft. The soft-interruption switching element 42 is also turned on in order to turn off the switching element Saβ when the sense voltage Vse becomes equal to or greater than the clamping threshold voltage Vcmp. This can advantageously suppress increase in the number of additional components.

(3) The present invention is directed to a system in which a series connection of the upper-arm switching element Sap and the lower-arm switching element San electrically connected in parallel with a capacitor C (as a DC voltage source) are driven. In such a system, when the upper arm switching element Sap and the lower-arm switching element San are both in the on-state where the switching elements Sap, San are short-circuited, the current flowing through the switching elements Sap, San may become excessively large. It is therefore advantageous that the soft-interruption switching element 42 is turned on when the sense voltage Vse becomes equal to or greater than the clamping threshold voltage Vcmp after the switching elements Sap, San are turned on.

Second Embodiment

There will now be explained a second embodiment of the present invention with reference to the accompanied drawings. Only differences of the second embodiment from the first embodiment will be explained.

Figure 6:
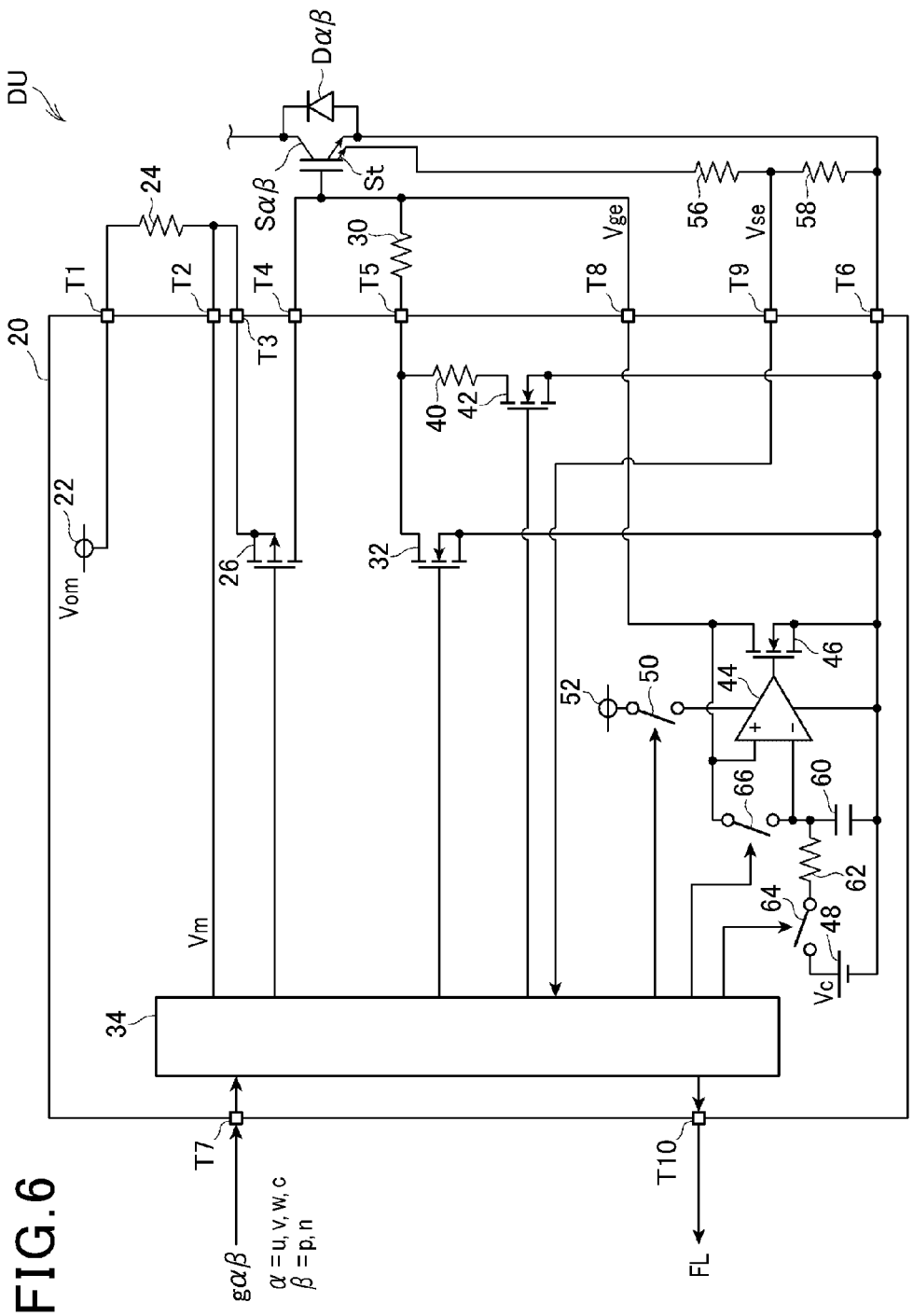
FIG. 6 shows a schematic circuit diagram of a drive unit of a second embodiment.

FIG. 6 shows a schematic block diagram of a drive unit DU of the present embodiment. Elements having the same functions as in the first embodiment shown in FIG. 1 are assigned the same numbers and will not be described again for brevity.

In the present embodiment, a process of clamping the gate voltage of the switching element Saβ at the clamping voltage Vc by using the switching element 46 is modified. More specifically, a series connection of a charge switching element 66 and a capacitor 60 are electrically connected between the gate (terminal T8) of the switching element Saβ and the emitter (terminal T6) of the switching element Saβ. A junction between the charge switching element 66 and the capacitor 60 is electrically connected to the inverting input terminal of the operational amplifier 44. The power supply 48 having a terminal voltage of the clamping voltage Vc is electrically connected to the inverting input terminal of the operational amplifier 44 through a resistor 62 and a filter switching element 64.

With this configuration, a combination of the resistor 62 and the capacitor 60 can serve as a resistor-capacitor (RC) circuit. This allows a voltage applied to the inverting input terminal of the operational amplifier 44 to be gradually lowered to the clamping voltage Vc depending on a time constant of the RC circuit by turning on the filter switching element 64 with the capacitor 60 being kept charged to a voltage greater than the clamping voltage Vc.

Figure 7:
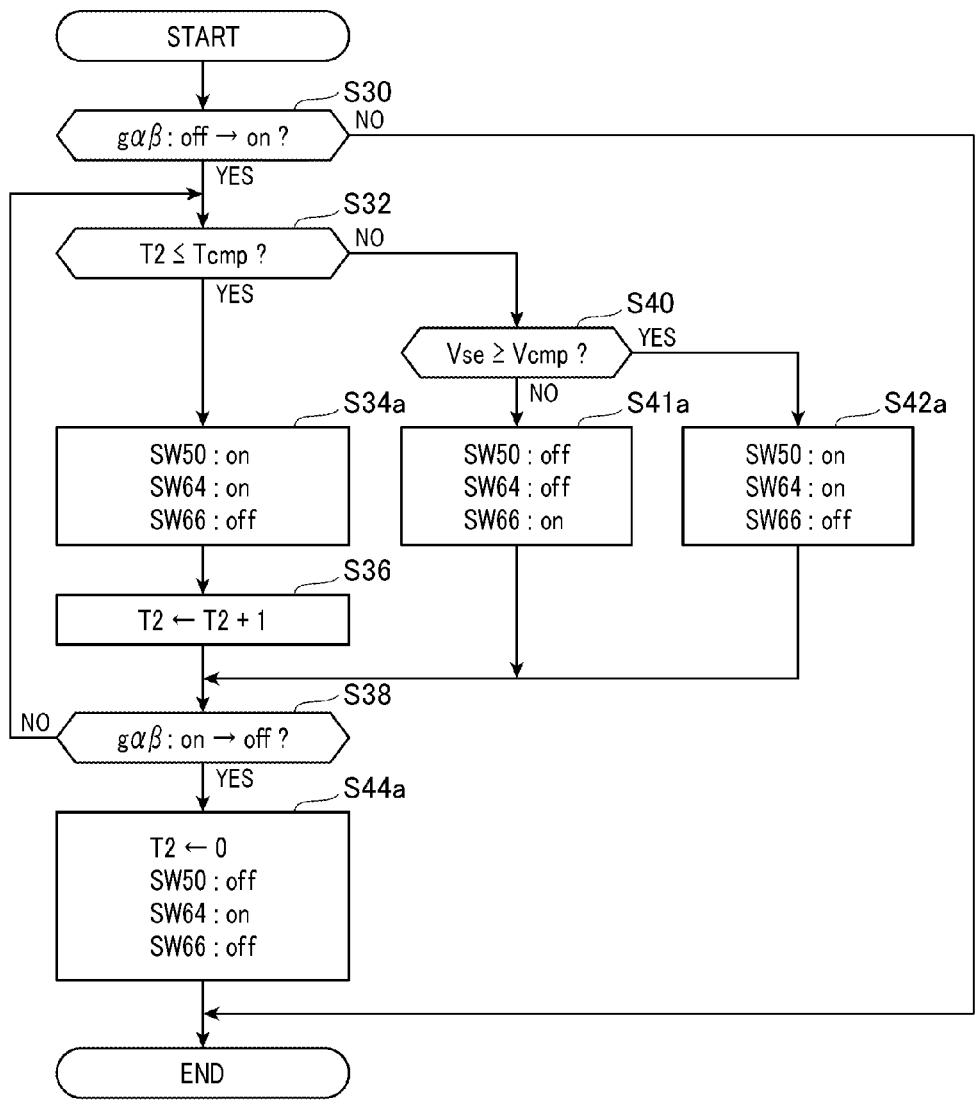
FIG. 7 shows a flowchart of a clamp process of the second embodiment.

FIG. 7 shows a flowchart of a clamp process performed by the drive controller 34 on the basis of the sense voltage Vse. For illustration, the same steps as shown in FIG. 4 are assigned the same numbers.

In the clamp process of the present embodiment, if it is determined in step S38 that the operation signal gaβ has changed from the turn-on instruction to the turn-off instruction, then in step s44a, the counter T2 is initialized to zero, the power-supply switching element 50 and the charge switching element 66 are turned off, and the filter switching element 64 is turned on. This allows the capacitor 60 to be charged to the clamping voltage Vc until the operation signal gaβ changes from the turn-off instruction to the turn-on instruction. Further, until the clamping threshold time Tcmp elapses since the operation signal gaβ has changed from the turn-off instruction to the turn-on instruction, the power-supply switching element 50 and the filter switching element 64 are kept in the on-state, and the charge switching element 66 is kept in the off state in step S34a. This allows the gate voltage Vge to be guarded with the clamping voltage Vc until the clamping threshold time Tcmp elapses.

After it is determined in step S32 that the clamping threshold time Tcmp has elapsed, if it is determined in step S40 that the sense voltage Vse is less than the clamping threshold voltage Vcmp, then the power-supply switching element 50 and the filter switching element 64 are turned off, and the charge switching element 66 is turned on. This allows the gate voltage Vge to be released from the gate voltage protection (or guard), and the capacitor 60 to be charged to a charging voltage greater than the clamping voltage Vc.

After it is determined in step S32 that the clamping threshold time Tcmp has elapsed, if it is determined in step S40 that the sense voltage Vse is equal to or greater than the clamping threshold voltage Vcmp, then in step S42a, the power-supply switching element 50 and the filter switching element 64 are turned on, and the charge switching element 66 is turned off. This allows the gate voltage Vge of the switching element Saβ to be guarded with the clamping voltage Vc (in the gate-voltage protection), where a voltage which allows the capacitor 60 to be charged to the gate voltage Vge of the switching element Saβ is applied to the gate of the clamping switching element 46. The voltage across the capacitor 60 is gradually lowered depending on the time constant of the RC circuit from the gate voltage Vge of the switching element Saβ immediately after it is determined in step S40 that the sense voltage Vse is equal to or greater than the clamping threshold voltage Vcmp to the clamping voltage Vc. This allows the gate voltage Vge of the switching element Saβ to be gradually lowered to the clamping voltage Vc.

A maximum current allowed to flow through the switching element Saβ when the gate voltage Vge is kept at the clamping voltage Vc is a little bit greater than a current that can flow through the switching element Saβ when the sense voltage Vse is kept at the clamping threshold voltage Vcmp. After completion of the operation in step S41a or the operation in step S42a, the process proceeds to step S38.

Figure 8:
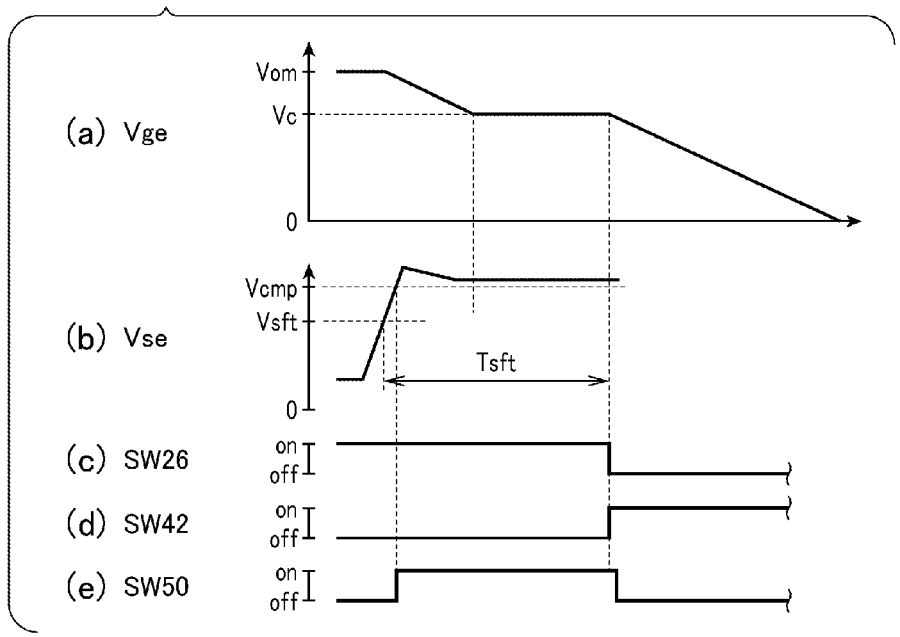
FIG. 8 shows timing diagrams for explaining benefits of the second embodiment.

FIG. 8 shows befits of the present embodiment. The timing diagrams (a)-(e) correspond to the timing diagrams (a)-(e) of FIG. 5B, respectively.

As shown in FIG. 8, in the present embodiment, once the sense voltage Vse becomes equal to or greater than the clamping threshold voltage Vcmp after the gate voltage Vge exceeds the threshold voltage Vth, the gate voltage Vge is gradually lowered to the clamping voltage Vc. This leads to a limited change rate of amount of current flowing through the switching element Saβ as the gate voltage Vge is gradually lowered to the clamping voltage Vc, and thus allows a surge voltage to be suppressed. When a duration in which the sense voltage Vse is equal to or greater than the soft-interruption threshold voltage Vsft becomes equal to or greater than the soft-interruption threshold time Tsft, the constant-current switching element 26 is turned off and the soft-interruption switching element 42 is turned on. The switching element Saβ is thereby forcibly turned off.

The second embodiment furnishes the following additional benefit to the above three benefits (1) to (3) of the first embodiment.

(4) Once the gate voltage Vge exceeds the threshold voltage Vth, the switching element Saβ is tuned on. Thereafter, when the sense voltage Vse becomes equal to or greater than the clamping threshold voltage Vcmp, the power-supply switching element 50 and the filter switching element 64 are turned on. This allows the gate voltage Vge to be gradually lowered to the clamping voltage Vc.

Third Embodiment

There will now be explained a third embodiment of the present invention with reference to the accompanied drawings. Only differences of the third embodiment from the second embodiment will be explained.

In the present embodiment, a voltage-drop rate at which the gate voltage Vge is lowered to the clamping voltage Vc by means of the clamping switching element 46 is set greater than a voltage-drop rate at which the gate voltage Vge is lowered to the clamping voltage Vc by turning on the soft-interruption switching element 42 (by selection means). This can be accomplished by adjusting the time constant of the RC circuit formed of the resistor 62 and the capacitor 60, and a resistance value of the soft-interruption resistor 40 and others.

Figure 9:
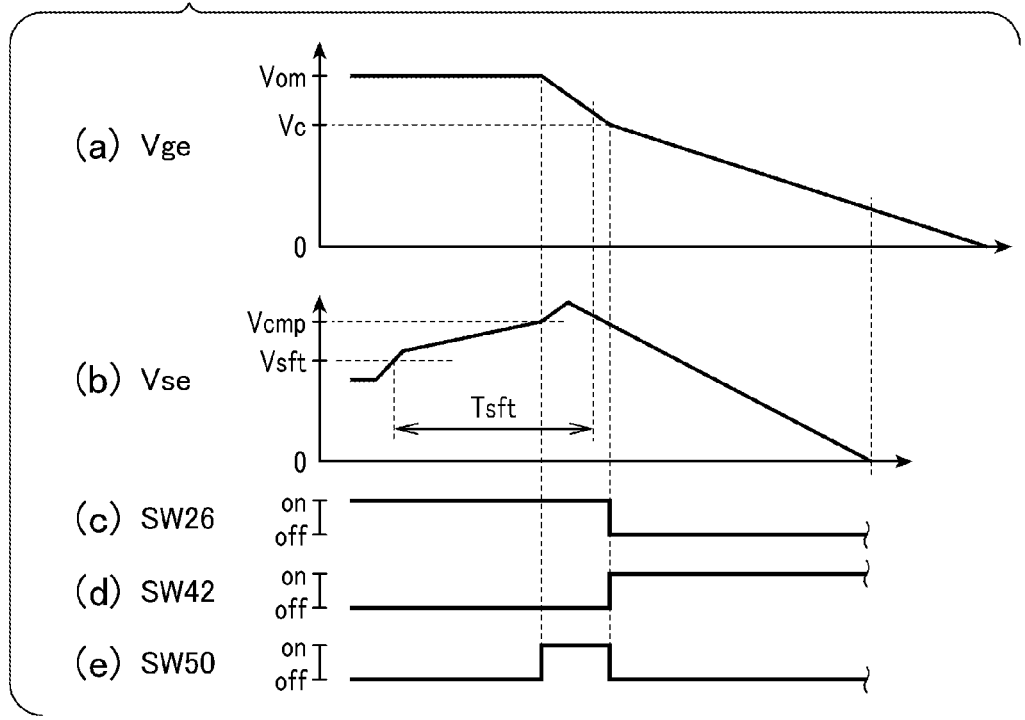
FIG. 9 shows timing diagrams for explaining exemplary execution of a soft-interruption process and a clamp process in accordance with a third embodiment.

As shown in FIG. 9, even when the soft-interruption threshold time Tsft elapses before the gate voltage Vge is lowered to the clamping voltage Vc by means of the clamping switching element 46, the soft-interruption switching element 42 is kept in the off state until the gate voltage Vge is lowered to reach the clamping voltage Vc. Lowering the gate voltage Vge to the clamping voltage Vc by means of the clamping switching element 46 may thus decrease a time period required for the switching element Saβ to be turned off. The timing diagrams (a)-(e) of FIG. 9 correspond to the timing diagrams (a)-(e) of FIG. 5B, respectively.

Fourth Embodiment

There will now be explained a fourth embodiment of the present invention with reference to the accompanied drawings. Only differences of the fourth embodiment from the second embodiment will be explained.

In the present embodiment, a voltage-drop rate at which the gate voltage Vge is lowered to the clamping voltage Vc by means of the clamping switching element 46 is set less than a voltage-drop rate at which the gate voltage Vge is lowered to the clamping voltage Vc by turning on the soft-interruption switching element 42 (by the selection means). This can be accomplished by adjusting the time constant of the RC circuit formed of the resistor 62 and the capacitor 60, and a resistance value of the soft-interruption resistor 40 and others.

Figure 10:
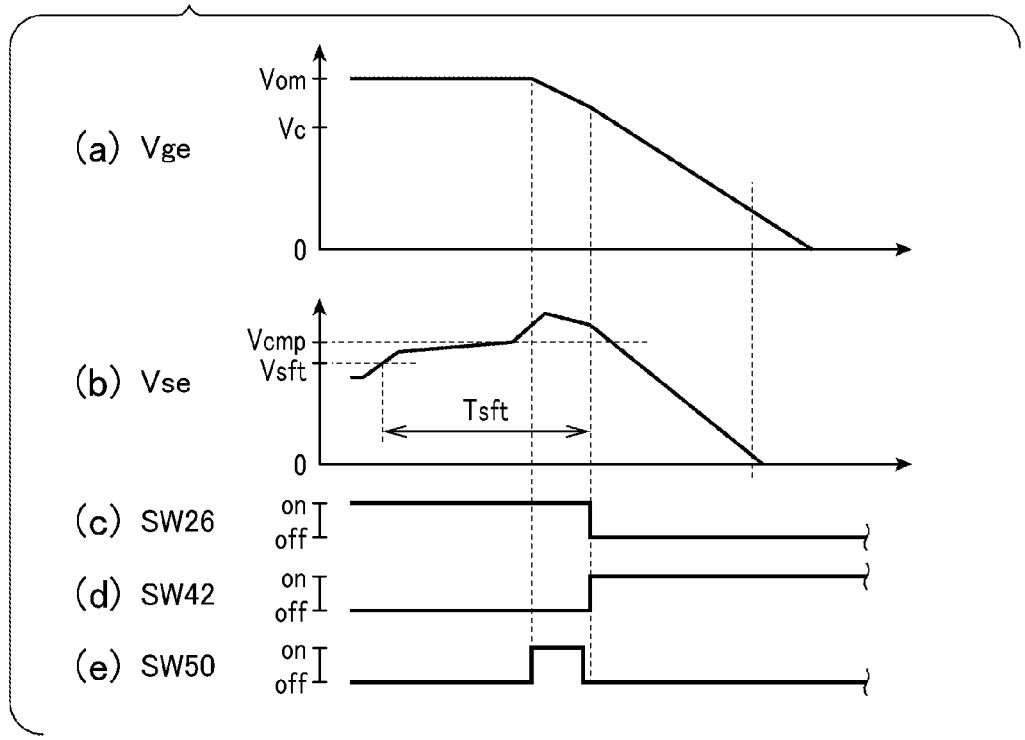
FIG. 10 show timing diagrams for explaining exemplary execution of a soft-interruption process and a clamp process in accordance with a fourth embodiment.

As shown in FIG. 10, when the soft-interruption threshold time Tsft elapses before the gate voltage Vge is lowered to the clamping voltage Vc by means of the clamping switching element 46, the gate voltage Vge is lowered to the clamping voltage Vc by using the soft-interruption switching element 42. Once the soft-interruption threshold time Tsft elapses, the power-supply switching element 50 is turned off. This may decrease a time period required for the switching element Saβ to be turned off. The timing diagrams (a)-(e) of FIG. 10 correspond to the timing diagrams (a)-(e) of FIG. 5B, respectively.

Other Embodiments

There will now be explained some other embodiments that may be devised without departing from the spirit and scope of the present invention.

Off-State-Transition Means (30, 32, 34)

For example, first and second discharge paths may be provided for discharging the gate of the switching element Saβ, where an impedance of the first discharge path is greater than that of the second discharge path. Active gate control may be performed when the gate of the switching element Saβ is discharged to turn off the switching element Saβ, where the discharge path is switched from the second discharge path to the first discharge path. The impedance of the discharge path for the soft-interruption means is set greater than the impedance of the first discharge path.

Clamp Means (44, 46, 48, 50, 52)

In the above embodiments, the impedance of the clamping switching element 46 is manipulated so that the gate voltage Vge decreases to the clamping voltage Vc. For example, a zener diode and the clamping switching element 46 may be provided, where a fixed voltage may be applied to the gate of the clamping switching element 46, and the gate voltage of the switching element Saβ may thereby be clamped at a breakdown voltage of the zener diode. In an alternative embodiment to the second embodiment described above, where the zener diode and the clamping switching element 46 are provided, it is desirable that a voltage applied to the gate of the clamping switching element 46 may be manipulated so that the gate voltage Vge may be lowered gradually to the breakdown voltage of the zener diode.

Soft-Interruption Means (30, 40, 42)

In the above embodiments, the gate resistor 30 is provided along the discharge path. Alternatively, for example, only the soft-interruption resistor 40 may be provided such that a resistance value of the soft-interruption resistor 40 is greater than a resistance value of the gate resistor 30.

Voltage-Drop-Rate Decreasing means (30, 40, 42, 60, 62, 64)

In the first embodiment, as shown in FIG. 4, if it is determined in step S40 that the sense voltage Vse is equal to or greater than the clamping threshold voltage Vcmp, then the soft-interruption switching element 42 is turned on in step S42. Alternatively, in step 42, when the gate voltage Vge is lowered to the clamping voltage Vc by turning on the soft-interruption switching element 42, the soft-interruption switching element 42 may once be turned off and the power-supply switching element 50 may be turned on. This can prevent the switching element Saβ from being forcibly turned off in error due to superimposition of noise onto the sense voltage Vse.

In an alternative embodiment to the first embodiment as shown in FIG. 2, the clamp means may be formed of a resistor, a zener diode, and the clamping switching element 46 and may be configured such that, once a certain time period elapses since the operation signal has changed from the turn-off instruction to the turn-on instruction, a resistance value of the resistor may be increased.

In an alternative embodiment to the first embodiment as shown in FIG. 2, a first discharge path used when it is determined in step S14 (in FIG. 3) that the counter value T1 is equal to or greater than the soft-interruption threshold time Tsft may be different from a second discharge path used when it is determined in step S40 (in FIG. 4) that the sense voltage Vse is equal to or greater than the clamping threshold voltage Vcmp. The impedance of the second discharge path may be greater than the impedance of the first discharge path, which may advantageously prevent a rate of decrease in current from being increased, under conditions where an amount of current is more likely to increase.

On-state-Transition Means (22, 24, 26, 34)

In the above embodiments, the charging current for charging the gate of the switching element Saβ is constant. Alternatively, for example, in FIG. 2, once the operation signal gaβ changes from the turn-off instruction to the turn-on instruction, a constant voltage may be applied to the gate of the constant-current switching element 26.

Switching Elements (Saβ)

In the above embodiments, the IGBTs are used for the switching elements Saβ. Alternatively, for example, N-channel or P-channel MOSFETs may be used, where a current path (between a source and a drain of each MOSFET) may be opened or closed by manipulating a potential at a switching control terminal (as the gate) relative to a potential at a reference terminal (having the same potential as the source).

In the above embodiments, the switching elements Saβ are used for the inverter INV or the converter CNV. Alternatively, the switching elements Saβ may be used for other components of the system.

DC Voltage Source (C)

In the above embodiments, the system shown in FIG. 1 includes the boost converter CNV. Alternatively, there may be provided the system without the boost converter CNV, where the high-voltage battery 12 may serve as the DC voltage source.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A driver apparatus for driving a voltage-controlled switching element, the apparatus comprising:
    on-state transition means for, in response to a first operation signal indicative of turn-on instruction, turning on the switching element by charging a switching control terminal of the switching element;
    off-state transition means for, in response to a second operation signal indicative of turn-off instruction, turning off the switching element by discharging the switching control terminal of the switching element;
    clamp means for clamping an absolute value of a voltage difference between a voltage at a reference terminal that is one of terminals of a current path of the switching element and a voltage at the switching control terminal of the switching element at a clamping voltage that is greater than a threshold voltage, a voltage above which applied to the switching control terminal allowing the switching element to be turned on; and
    voltage-drop-rate decreasing means for, when an amount of current flowing through the current path of the switching element becomes equal to or greater than a clamp threshold value after the switching element transitions from an off-state to an on-state, decreasing a voltage-drop-rate at which the absolute value of the voltage difference is decreased to the clamping voltage as compared to a voltage-drop-rate at which the absolute value of the voltage difference is decreased to the clamping voltage by the off-state transition means only.

2. The apparatus of claim 1, further comprising:
    soft-interruption means for discharging the switching control terminal of the switching element to decrease the absolute value of the voltage difference to less than the threshold voltage, an impedance of a discharge path of the soft-interruption means being greater than an impedance of a discharge path of the off-state transition means,
    the voltage-drop-rate decreasing means is configured to, when an amount of current flowing through the current path of the switching element becomes equal to or greater than the clamp threshold value after the switching element transitions from the off-state to the on-state, inhibit the clamp means from operating, and decrease the absolute value of the voltage difference to the clamping voltage by using the soft-interruption means.

3. The apparatus of claim 2, further comprising:
    transient protection means for, when a duration in which the amount of current flowing through the current path of the switching element is equal to or greater than a soft-interruption threshold value is equal to greater than a prescribed time period, discharging the switching control terminal of the switching element to decrease the absolute value of the voltage difference to the clamping voltage by using the soft-interruption means.

4. The apparatus of claim 1, wherein
    the clamp means is configured to, when the amount of current following through the current path of the switching element is equal to greater than the clamp threshold value, clamp the absolute value of the voltage difference at the clamping voltage, and
    the voltage-drop-rate decreasing means is configured to decrease the voltage-drop-rate at which the absolute value of the voltage difference is decreased to the clamping voltage by the clamp means to less than the voltage-drop-rate at which the absolute value of the voltage difference is decreased to the clamping voltage by the off-state transition means.

5. The apparatus of claim 4, further comprising:
    soft-interruption means for discharging the switching control terminal of the switching element to decrease the absolute value of the voltage difference to less than the threshold voltage, an impedance of a discharge path of the soft-interruption means being greater than an impedance of a discharge path of the off-state transition means; and
    transient protection means for, when a duration in which the amount of current flowing through the current path of the switching element is equal to or greater than a soft-interruption threshold value is equal to greater than a prescribed time period, discharging the switching control terminal of the switching element by using the soft-interruption means.

6. The apparatus of claim 5, wherein
the voltage-drop-rate at which the absolute value of the voltage difference is decreased to the clamping voltage by the clamp means is greater than the voltage-drop-rate at which the absolute value of the voltage difference is decreased to the clamping voltage by the soft-interruption means, and
when, after transition of the switching element from the off-state to the on-state, the absolute value of the voltage difference is greater than the clamping voltage at the time that the duration in which the amount of current following through the current path of the switching element is equal to or greater than the soft-interruption threshold value becomes equal to greater than the prescribed time period, the absolute value of the voltage difference is decreased to the clamping voltage by the clamp means.

7. The apparatus of claim 5, wherein
the voltage-drop-rate at which the absolute value of the voltage difference is decreased to the clamping voltage by the soft-interruption means is greater than the voltage-drop-rate at which the absolute value of the voltage difference is decreased to the clamping voltage by the clamp means, and
when, after transition of the switching element from the off-state to the on-state, the absolute value of the voltage difference is greater than the clamping voltage at the time that the duration in which the amount of current following through the current path of the switching element is equal to or greater than the soft-interruption threshold value becomes equal to greater than the prescribed time period, the absolute value of the voltage difference is decreased to the clamping voltage by the soft-interruption means.

8. The apparatus of claim 5, further comprising:
selection means for, when, after transition of the switching element from the off-state to the on-state, the absolute value of the voltage difference is greater than the clamping voltage at the time that the duration in which the amount of current following through the current path of the switching element is equal to or greater than the soft-interruption threshold value becomes equal to greater than the prescribed time period, selecting one of the clamp means and the soft-interruption means, which has a greater voltage-drop rate at which the absolute value of the voltage difference is decreased to the clamping voltage, for decreasing the absolute value of the voltage difference to the clamping voltage.

9. The apparatus of claim 1, wherein the switching element is an IGBT, and the current path is an electrical-current flow path between the emitter and the collector of the switching element.

10. The apparatus of claim 1, comprising a series connection of a pair of voltage-controlled switching elements electrically connected in parallel with a DC voltage source, and comprising, for each of the pair of switching elements, the on-state transition means, the off-state transition means, the clamp means, and the voltage-drop-rate decreasing means to drive the switching element.

* * * * *